United States Patent
Kinpara et al.

(10) Patent No.: US 7,408,322 B2
(45) Date of Patent: Aug. 5, 2008

(54) DEVICE FOR DETERMINING CONSTANT OF ROTATING MACHINE

(75) Inventors: Yoshihiko Kinpara, Tokyo (JP); Masahiro Fukuta, Tokyo (JP)

(73) Assignees: Mitsubishi Denki Kabushiki Kaisha, Tokyo (JP); Mitsubishi Electric Building Techno-Service Co., Ltd., Tokyo (JP)

( * ) Notice: Subject to any disclaimer, the term of this patent is extended or adjusted under 35 U.S.C. 154(b) by 309 days.

(21) Appl. No.: 10/554,549

(22) PCT Filed: Jun. 6, 2003

(86) PCT No.: PCT/JP03/07211

§ 371 (c)(1),
(2), (4) Date: Oct. 27, 2005

(87) PCT Pub. No.: WO2004/109310

PCT Pub. Date: Dec. 16, 2004

(65) Prior Publication Data

US 2006/0290338 A1    Dec. 28, 2006

(51) Int. Cl.
*H02P 23/00*    (2006.01)
(52) U.S. Cl. .......... 318/799; 318/727; 318/254; 318/138; 318/439
(58) Field of Classification Search ........... 318/799, 318/727, 254, 138, 439; 702/181; 700/108
See application file for complete search history.

(56) References Cited

U.S. PATENT DOCUMENTS

| 5,475,293 A | 12/1995 | Sakai et al. |
| 6,066,934 A | 5/2000 | Kaitani et al. |
| 2004/0193387 A1* | 9/2004 | Jinyama ............ 702/181 |

FOREIGN PATENT DOCUMENTS

| JP | 02-304380 | 12/1990 |
| JP | 03-117347 | 5/1991 |
| JP | 06-273496 | 9/1994 |
| JP | 07-055899 | 3/1995 |

* cited by examiner

*Primary Examiner*—Karen Masih
(74) *Attorney, Agent, or Firm*—Leydig, Voit & Mayer, Ltd.

(57) ABSTRACT

A device for determining a constant of a rotating machine includes: a test number selector outputting a test number n, selected from 1 to N (N≧2), and outputting a phase signal q determined by a predetermined condition that is previously set based on the test number n; a tester for supplying an alternating voltage to the rotating machine induction machine based on the test number n and the phase signal q and outputting a reference phase gain and a 90-degree-delay phase gain based on values of the phase signal q corresponding to 1 to N of the test number n; and a rotating machine constant calculator receiving the reference phase gain and the 90-degree-delay phase gain and then calculating a constant of the rotating machine using the reference phase gain and the 90-degree-delay phase gain.

6 Claims, 9 Drawing Sheets

DEVICE FOR DETERMINING CONSTANT OF ROTATING MACHINE

TECHNICAL FIELD

The present invention relates to a device for determining a constant of a rotating machine, and particularly to a device for determining a constant of a rotating machine for determining electric constants of a rotating machine (e.g., primary resistance Rs, secondary resistance Rr, self-inductance L, mutual inductance M, etc.) with the rotating machine staying unrotating.

BACKGROUND ART

In a conventional device for determining a constant of a rotating machine, e.g., as described in JP 2-304380 A (particularly, pp. 5-9, FIGS. 8-10) (hereinafter referred to as Patent Document 1), with an induction machine (rotating machine) using an inverter as a driving power source, the inverter output voltage is generated to produce a single-phase power-supply state or a power-supply state equivalent thereto, and the voltage and frequency, and the current flowing in the induction machine are substituted in an induction machine transfer function expression to obtain primary resistance, secondary resistance, primary self-inductance, secondary self-inductance, and mutual inductance.

Other conventional examples include that described in JP 6-273496A (particularly, pp. 4-9, FIGS. 1-5) (hereinafter referred to as Patent Document 2), for example. A three-phase voltage command signal is generated according to a d-axis voltage command, a q-axis voltage command, and a primary angular frequency command, and the output voltage of a power converter is controlled in proportion thereto and applied to the rotating machine. While the output current of the inverter is detected and d-axis and q-axis current components are detected according to the detected current and the primary angular frequency command, an AC signal is given as the value of the d-axis voltage command, with the values of the primary angular frequency command and the q-axis voltage command being zero. Next, according to the three-phase voltage command signal generated on the basis thereof, the converter output voltage is applied to the rotating machine. At this time, the d-axis current component flowing in the rotating machine is detected and the detected value is analyzed according to Fourier expansion based on trigonometric functions, using the AC signal as a reference, and constants of the rotating machine are obtained on the basis of Fourier coefficients for the fundamental wave component and the AC signal value.

Also, other conventional examples include that described in JP 7-55899 A (particularly, pp. 5-13, FIGS. 1-3) (hereinafter referred to as Patent Document 3), for example. A three-phase voltage command signal is generated according to a d-axis voltage command, a q-axis voltage command and a primary angular frequency command, and the output voltage of a power converter is controlled in proportion thereto and applied to the rotating machine. While the output current is detected and d-axis and q-axis current components are detected according to the detected current and the primary angular frequency command, an AC signal is given as the value of the d-axis voltage command, with the values of the primary angular frequency command and the q-axis voltage command being zero, and the converter output voltage is applied to the rotating machine according to the three-phase voltage command signal generated on the basis thereof. At this time, the d-axis current component flowing in the rotating machine is detected and the detected value is analyzed according to Fourier expansion, using the AC signal as a reference. In obtaining Fourier coefficients for the fundamental wave component, two frequencies are used about the AC signal, and constants of the rotating machine are obtained from the relation between the Fourier coefficients and current component values corresponding to the Fourier coefficients, obtained from the frequency characteristic of output current/input voltage in a rotating machine model.

All of the conventional devices for determining a constant of a rotating machine described above determine the constants by solving simultaneous equations corresponding to the number of unknown constants. Therefore, because of restrictions by the simultaneous equations, the number of times that the frequency of the alternating voltage is selected during a single-phase power supply is limited to twice or three times, and it is therefore not possible to repeatedly perform the test many times to obtain enhanced accuracy in determining the constants.

Also, because the conventional device for determining a constant of a rotating machine determines the constants with simultaneous equations about gains of rotating machines, it is not possible to obtain proper solutions of the equations in frequency bands where the gain is fixed, which places limitations on the alternating voltage frequency band during the single-phase power supply.

Also, while inductance values of rotating machines depend on current amplitude because of magnetic saturation, the above-described conventional devices for determining a constant of a rotating machine do not consider the current amplitude and so cannot determine inductance values required to actually drive the rotating machines.

SUMMARY OF THE INVENTION

The present invention has been made to solve the problems above, and an object of the invention is to obtain a device for determining a constant of a rotating machine capable of accurately obtaining constants of a rotating machine required to drive the rotating machine.

A device for determining a constant of a rotating machine according to the invention includes: test number selecting means for outputting a test number n, selected from 1 to N (N≧2), and outputting a phase signal q determined by a predetermined condition previously set based on the test number n; test means for supplying an alternating voltage to the rotating machine based on the test number n and the phase signal q to obtain and output a reference phase gain (a(1), a(2), . . . , a(N)) and a 90-degree-delay phase gain (b(1), b(2), . . . , b(N)) based on values of the phase signal q corresponding to 1 to N of the test number n; and rotating machine constant calculating means receiving the reference phase gain (a(1), a(2), . . . , a(N)) and the 90-degree-delay phase gain (b(1), b(2), . . . , b(N)) and then calculating a constant of the rotating machine using the reference phase gain and the 90-degree-delay phase gain, whereby the test can be repeated a plurality of times to obtain enhanced accuracy in determining the constant, without being restricted in the number of times that the alternating voltage frequency is selected during single-phase power supply.

BEST MODE FOR CARRYING OUT THE INVENTION

First Embodiment

Figure 1:
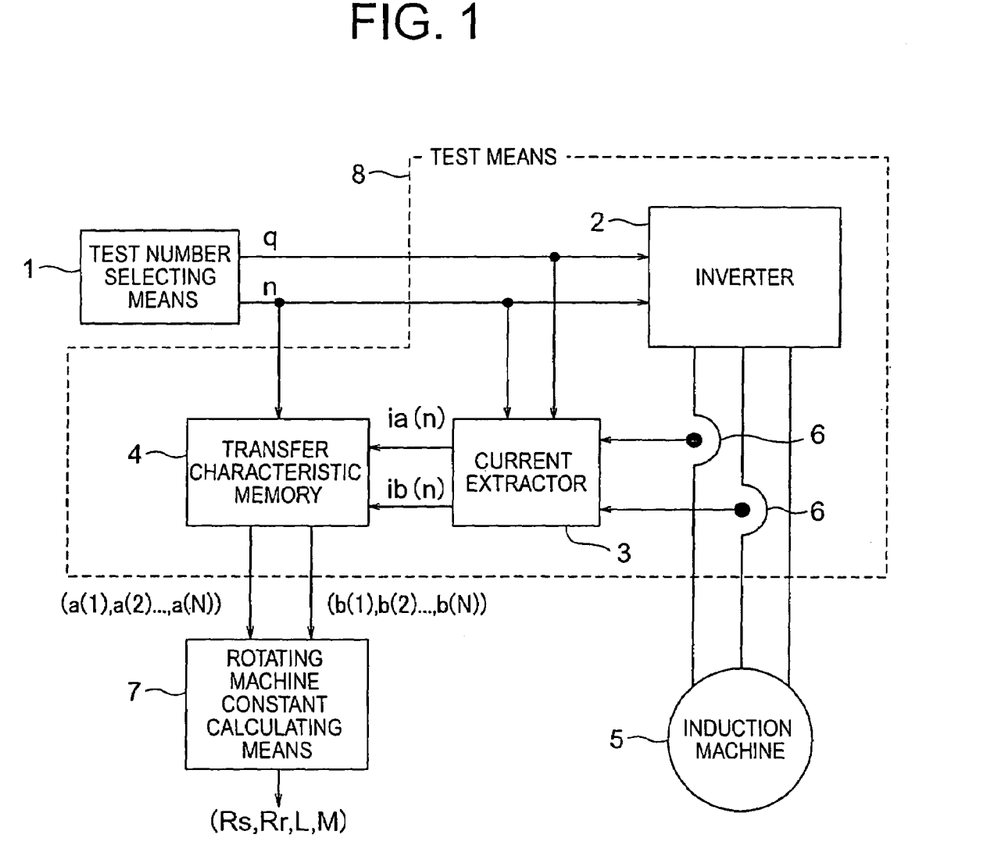
FIG. 1 is a block diagram illustrating the configuration of a device for determining a constant of a rotating machine according to a first embodiment of the present invention.

FIG. 1 is a diagram illustrating the configuration of a device for determining constants of a rotating machine according to a first embodiment of the present invention. As shown in FIG. 1, the device for determining a constant of a rotating machine of the first embodiment includes test number selecting means 1 that selects and outputs a test number, test means 8 that conducts a test by applying voltage to an induction machine (rotating machine) 5 according to the test number obtained from the test number selecting means 1, and rotating machine constant calculating means 7 that receives outputs from the test means 8 and calculates and outputs constants of the induction machine (rotating machine) 5.

The test number selecting means 1 sequentially selects a test number n, from 1 to N, according to predetermined timing, so as to output N kinds of test numbers to the test means 8, and also outputs a phase signal q as will be described later.

The test means 8 includes an inverter 2, a current extractor 3, a transfer characteristic memory 4, and current detectors 6.

The inverter 2 applies to the induction machine (rotating machine) 5 predetermined alternating voltage in accordance with the test number n obtained from the test number selecting means 1, where the inverter 2 uses the phase signal q obtained from the test number selecting means 1 as a reference phase.

The current detectors 6 detect instantaneous current values when the inverter 2 applies the alternating voltage to the induction machine 5.

From the instantaneous current values detected by the current detectors 6, the current extractor 3 extracts an in-phase component current ia(n) that is in the same phase with the reference phase and a 90-degree-delay phase component current ib(n), using the phase signal q obtained from the test number selecting means 1 as a reference phase. The current extractor 3 outputs the ia(n) and ib(n) to the transfer characteristic memory 4 according to the timing by which the value of the test number n changes.

Then, the transfer characteristic memory 4 divides ia(n) and ib(n), which are obtained in accordance with the test number n, by an amplitude V(n) of the predetermined alternating voltage. The transfer characteristic memory 4 stores the obtained values respectively as a reference phase gain a(n) and a 90-degree-delay phase gain b(n). Then, when receiving the test number N from the test number selecting means 1, the transfer characteristic memory 4 outputs the reference phase gains (a(1), a(2), . . . , a(N)) and the 90-degree-delay phase gains (b(1), b(2), . . . , b(N)) to the rotating machine constant calculating means 7, after a predetermined time for ending the alternating voltage application from the inverter 2 has passed.

Receiving the reference phase gains (a(1), a(2), . . . , a(N)) and the 90-degree-delay phase gains (b(1), b(2), . . . , b(N)) from the transfer characteristic memory 4, the rotating machine constant calculating means 7 calculates given mathematical equations using the gains and outputs constants of the induction machine (rotating machine) 5, i.e., primary resistance Rs, secondary resistance Rr, primary inductance Ls, and mutual inductance M.

In the test number selecting means 1, N angular frequencies ω(n) (n=1, 2, . . . , N) are previously determined for the respective values of the test number n. The angular frequencies ω(n) may be given as, e.g., a geometric progression or as an arithmetic progression. An angular frequency ω(n) is selected according to the output test number n, and the phase signal q is outputted as shown by Equation (1) below.

$$q = \omega(n) \times t - 2\pi \times INT\left(\frac{\omega(n) \times t}{2\pi}\right) \quad (1)$$

Where, t is time and INT(x) is an integer value obtained by omitting decimals of x.

Figure 2:
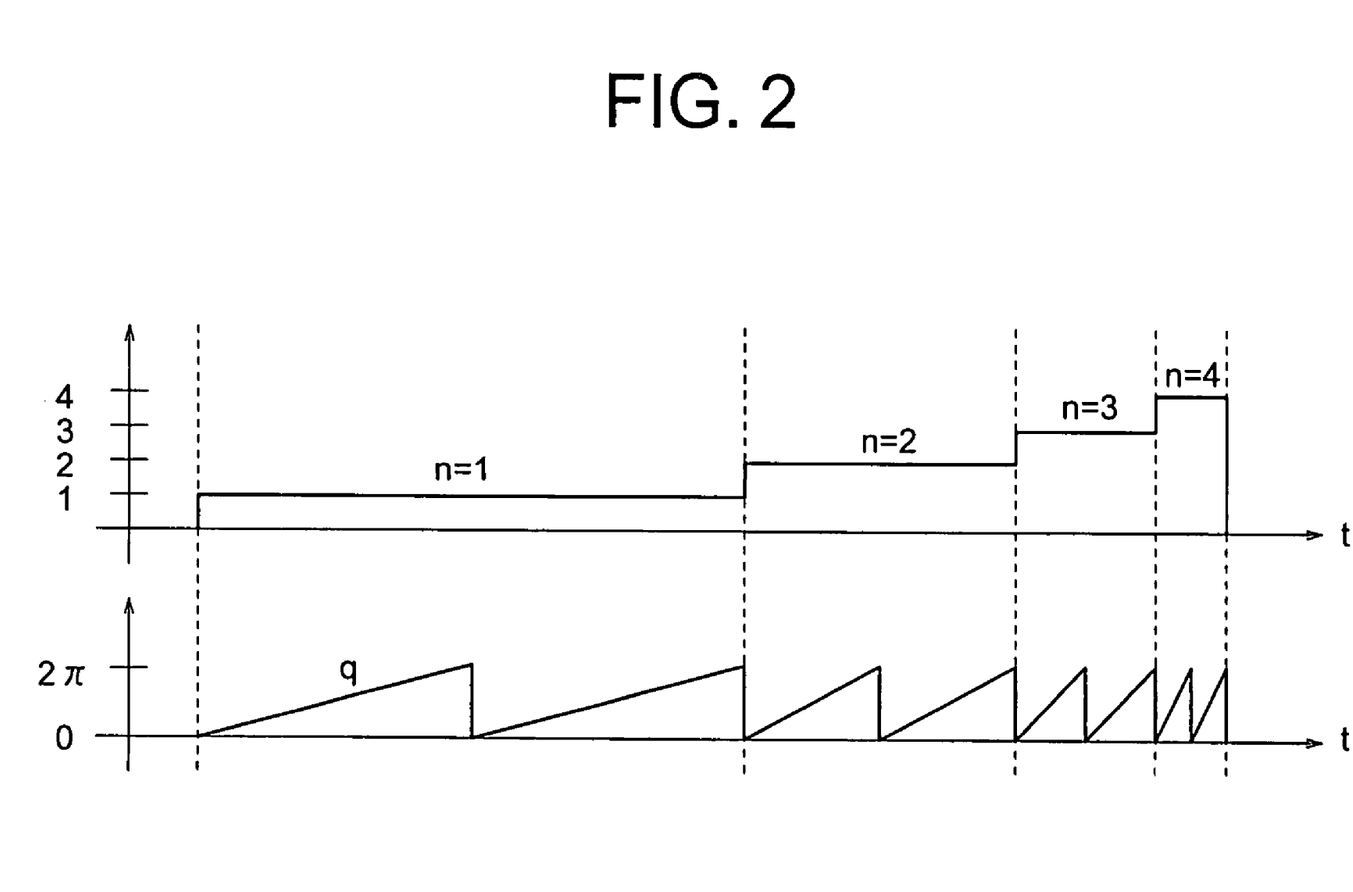
FIG. 2 is an illustrative diagram used to describe variations of a test number n and a phase signal q in the test number selecting means of the device for determining a constant of a rotating machine according to the first embodiment of the present invention.

FIG. 2 shows an example of the test number n and the phase signal q outputted from the test number selecting means 1 when N=4. In this example, ω(n) is given as a geometric progression and the value of n is varied when the phase signal q achieves two cycles.

While, in general, a board diagram of an induction machine transfer characteristic is plotted on a logarithmic graph, varying ω(n) as a geometric progression in this way makes it possible to conduct the test with the angular frequencies at equal intervals on the board diagram.

The angular frequency ω(n) may be varied as an arithmetic progression, or may be given as arbitrary values. Also, the value of n may be varied when the phase signal q achieves a different number of cycles, or the value of n may be varied independently of the cycle of the phase signal q.

The inverter 2 previously defines N kinds of alternating voltage amplitudes V(n) (n=1, 2, . . . , N). The alternating voltage amplitudes V(n) may be given as V(1)=V(2)= . . . =V(N), or as an arithmetic progression or a geometric progression. Then, on the basis of the phase signal q and Equations (2) and (3) below, voltage commands vd and vq on static orthogonal two axes are set for the induction machine 5.

$$vd = V(n) \times \sin(q) + C \quad (2)$$

$$vq = 0 \quad (3)$$

Where,
vd: d-axis voltage command on static orthogonal two axes,
vq: q-axis voltage command on static orthogonal two axes,
V(n): predetermined alternating voltage amplitude,
ω(n): angular frequency uniquely determined for predetermined test number n,
t: time, and
C: arbitrary constant.

While the embodiment defines the value of the constant C as C=0 in order to simplify the description, an arbitrary value may be given to obtain the same effect. The relation shown by Equation (4) below holds between vd, vq and the three-phase voltages vu, vv, vw.

$$\begin{pmatrix} vu \\ vv \\ vw \end{pmatrix} = \sqrt{\frac{2}{3}} \begin{pmatrix} 1 & 0 \\ -\frac{1}{2} & \frac{\sqrt{3}}{2} \\ -\frac{1}{2} & -\frac{\sqrt{3}}{2} \end{pmatrix} \begin{pmatrix} vd \\ vq \end{pmatrix} \quad (4)$$

Then, the inverter 2 applies to the induction machine 5 the three-phase voltages vu, vv, and vw obtained by Equations (2) to (4). While the three-phase voltages vu, vv, and vw obtained by Equations (2) to (4) are alternating voltage, the induction machine 5 does not rotate with the application of alternating voltage. Thus, by applying the alternating voltage obtained by Equations (2) to (4) to the induction machine 5, the inverter 2 causes the induction machine 5 to generate current without causing the induction machine 5 to rotate.

The current extractor 3 converts the instantaneous current values iu and iv, obtained from the current detectors 6, to a current id on orthogonal two axes, according to Equation (5) below.

$$id = \sqrt{\frac{2}{3}} \left( iu - \frac{1}{2} iv - \frac{1}{2} iw \right) \quad (5)$$

In this process, the current detectors 6 of this embodiment are only capable of detecting iu and iv, and so iw is given by Equation (6) below.

$$iw = -iu - iv \quad (6)$$

Figure 3:
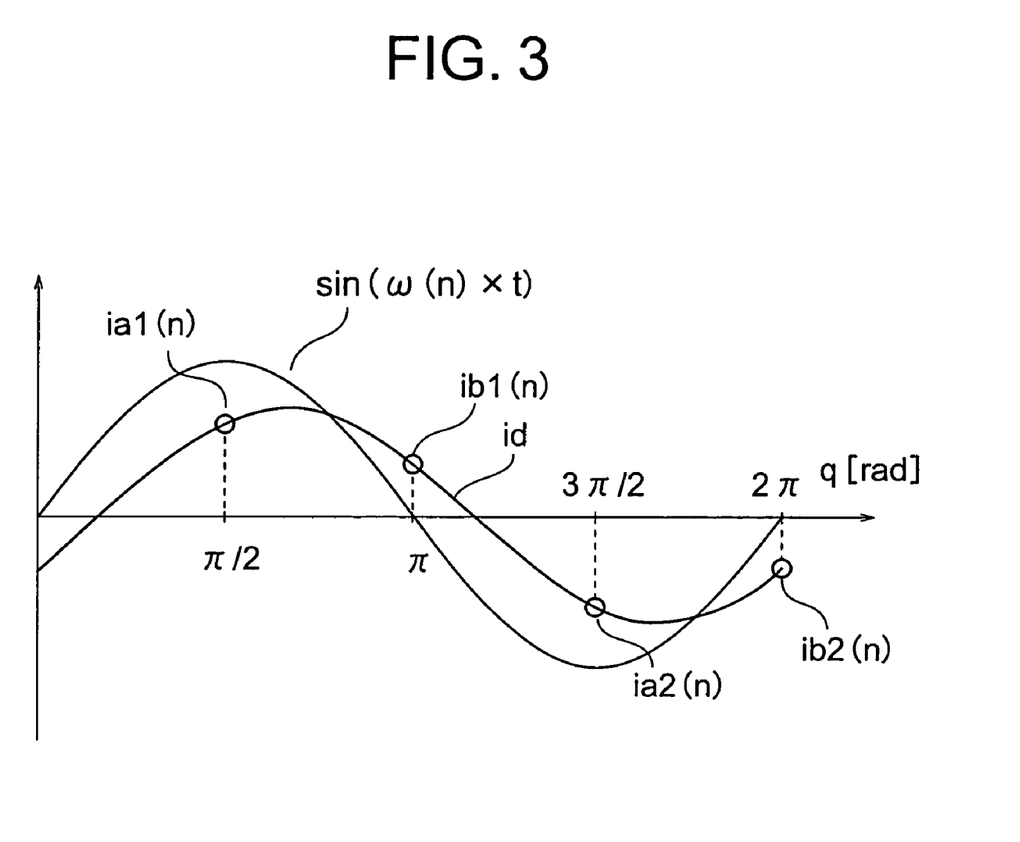
FIG. 3 is an illustrative diagram used to describe operations of the current extractor of the device for determining a constant of a rotating machine according to the first embodiment of the present invention.

Referring to FIG. 3, a method will be described in which the current extractor 3 extracts the in-phase component current ia(n) and the 90-degree-delay phase component current ib(n) from the current id, by using the phase signal q as a reference phase. Suppose that, during the period of a test number n, id is ia1(n) when the phase signal q is π/2 and id is ia2(n) when q is 3π/2. Similarly, suppose that id is ib1(n) when the phase signal q is π and id is ib2(n) when q is 2π. Then, the in-phase component ia(n) and the 90-degree-delay phase component ib(n) are given by Equations (7) and (8) below.

$$ia(n)=(ia1(n)-ia2(n))\times 0.5 \quad (7)$$

$$ib(n)=(ib1(n)-ib2(n))\times 0.5 \quad (8)$$

When the test number n changes to n+1, the current extractor 3 outputs the ia(n) and ib(n) to the transfer characteristic memory 4. However, when the test number is N, the test number does not become N+1, and therefore the current extractor 3 outputs ia(N) and ib(N) to the transfer characteristic memory 4 after a predetermined time has passed.

Thus, during the period of a test number n, the current extractor 3 detects id when the phase signal q is π/2, π, 3π/2, and 2π, and extracts the in-phase component ia(n) and the 90-degree-delay phase component ib(n) on the basis of the detected values and Equations (7) and (8), which is advantageous in that the current can be extracted by very simple mathematical expressions, just including addition and multiplication, without integration.

Next, operations of the transfer characteristic memory 4 will be described. Receiving ia(n) and ib(n) from the current extractor when the test number n from the test number selecting means 1 changes to n+1, the transfer characteristic memory 4 divides the ia(n) and ib(n) by the previously stored V(n) as shown by Equations (9) and (10) below so as to obtain a(n) and b(n), and stores the test number n, a(n), and b(n).

$$a(n)=ia(n)\div V(n) \quad (9)$$

$$b(n)=ib(n)\div V(n) \quad (10)$$

Then, when a predetermined time has passed after the test number achieved N, the transfer characteristic memory 4 outputs the reference phase gains (a(1), a(2), ..., a(N)) and the 90-degree-delay phase gains (b(1), b(2), ..., b(N)) to the rotating machine constant calculating means 7.

On the basis of the reference phase gains (a(1), a(2), ..., a(N)) and the 90-degree-delay phase gains (b(1), b(2), ..., b(N)), the rotating machine constant calculating means 7 calculates the rotating machine constants Rs, Rr, Ls, and M. The principle of the operation of the rotating machine constant calculating means 7 will be described hereinafter.

The transfer function from alternating voltage to alternating current is given by Equation (11) below, as shown on page 6 in the Patent Document 1.

$$G(s) = \frac{\frac{1}{\sigma Ls}\left(s + \frac{Rr}{Lr}\right)}{s^2 + \left(\frac{Rs}{\sigma Ls} + \frac{Rr}{\sigma Lr}\right)s + \frac{RsRr}{\sigma LsLr}} \quad (11)$$

$$= \frac{1}{Rs} \frac{1 + Trs}{1 + (Ts + Tr)s + \sigma TsTrs^2}$$

$$= \frac{\beta 0 + \beta 1 s}{1 + \alpha 1 s + \alpha 2 s^2}$$

Where, s: Laplace operator, σ: leakage factor
Ts=Ls/Rs
Tr=Lr/Rr
α1=Ts+Tr
α2=σTsTr
β0=1/Rs
β1=Tr/Rs Next, A(s) and B(s) are defined by Equations (12) and (13).

$$A(s)=1+\alpha 1\times s+\alpha 2\times s^2 \quad (13)$$

$$B(s)=\beta 0+\beta 1\times s \quad (14)$$

With the test number n, the reference phase gain is a(n) and the 90-degree-delay phase gain is b(n). Accordingly, the transfer characteristic G0(jω(n)) shown by the test results with the test number n is given by Equation (15) below.

$$G0(j\omega(n))=a(n)+j\times b(n) \quad (15)$$

On the other hand, on the basis of Equation (11), the transfer characteristic G(jω(n)) with the test number n are given by Equation (16) below.

$$G(j\omega(n))=B(j\omega(n))\div A(j\omega(n)) \quad (16)$$

Multiplying Equation (16) by A(jω(n)) gives Equation (17) below.

$$A(j\omega(n))G(j\omega(n))=B(j\omega(n)) \quad (17)$$

Then, a deviation e(n) is defined by Equation (18).

$$e(n)=A(j\omega(n))G0(j\omega(n))-B(j\omega(n)) \quad (18)$$

In Equations (17) and (18), G0(jω(n)) and G(jω(n)) are complex numbers, and so the deviation e(n) is also a complex number. Then, the real part and imaginary part of the deviation e(n) are defined as er(n) and ei(n), respectively.

Also, a deviation vector E is defined by Equation (19) below, as an error of deviations between the rotating machine transfer characteristic gains calculated about the N angular frequencies determined by the test numbers n and the reference phase gains (a(1), a(2), . . . , a(N)) and 90-degree-delay phase gains (b(1), b(2), . . . , b(N)).

$$E = \begin{pmatrix} er(1) \\ ei(1) \\ er(2) \\ ei(2) \\ \vdots \\ er(N) \\ ei(N) \end{pmatrix} \quad (19)$$

Herein, a product of the deviation vector E and the transpose $E^T$ of the deviation vector is given by Equation (20) below.

$$E \cdot E^T = er(1)^2 + ei(1)^2 + er(2)^2 + ei(2)^2 + \ldots + er(N)^2 + ei(N)^2 \quad (20)$$

That is, the left side of Equation (20) is a square of error E. Equation (18) is then substituted in Equation (19) to obtain Equation (21).

$$E = \begin{pmatrix} -\omega(1)b(1) & -\omega(1)^2 a(1) & -1 & 0 \\ \omega(1)a(1) & -\omega(1)^2 b(1) & 0 & -\omega(1) \\ -\omega(2)b(2) & -\omega(2)^2 a(2) & -1 & 0 \\ \omega(2)a(2) & -\omega(2)^2 b(2) & 0 & -\omega(2) \\ \vdots & \vdots & \vdots & \vdots \\ -\omega(N)b(N) & -\omega(N)^2 a(N) & -1 & 0 \\ \omega(N)a(N) & -\omega(N)^2 b(N) & 0 & -\omega(N) \end{pmatrix} \begin{pmatrix} \alpha 1 \\ \alpha 2 \\ \beta 0 \\ \beta 1 \end{pmatrix} - \begin{pmatrix} -a(1) \\ -b(1) \\ -a(2) \\ -b(2) \\ \vdots \\ -a(N) \\ -b(N) \end{pmatrix}$$

$$= X1 \begin{pmatrix} \alpha 1 \\ \alpha 2 \\ \beta 0 \\ \beta 1 \end{pmatrix} - X2 \quad (21)$$

Where, $$X1 = \begin{pmatrix} -\omega(1)b(1) & -\omega(1)^2 a(1) & -1 & 0 \\ \omega(1)a(1) & -\omega(1)^2 b(1) & 0 & -\omega(1) \\ -\omega(2)b(2) & -\omega(2)^2 a(2) & -1 & 0 \\ \omega(2)a(2) & -\omega(2)^2 b(2) & 0 & -\omega(2) \\ \vdots & \vdots & \vdots & \vdots \\ \omega(N)b(N) & -\omega(N)^2 a(N) & -1 & 0 \\ \omega(N)a(N) & -\omega(N)^2 b(N) & 0 & -\omega(N) \end{pmatrix}$$

$$X2 = \begin{pmatrix} -a(1) \\ -b(1) \\ -a(2) \\ -b(2) \\ \vdots \\ -a(N) \\ -b(N) \end{pmatrix}$$

When N>2, $(\alpha 1, \alpha 2, \beta 0, \beta 1)^T$ that minimize the left side of Equation (20), i.e., $(\alpha 1, \alpha 2, \beta 0, \beta 1)^T$ that make the error E the least square, are given by Equation (22).

$$\begin{pmatrix} \alpha 1 \\ \alpha 2 \\ \beta 0 \\ \beta 1 \end{pmatrix} = (X1^T X1)^{-1} X1 X2 \quad (22)$$

When N=2 in Equation (22), there are four unknowns ($\alpha 1$, $\alpha 2$, $\beta 0$, $\beta 1$) and the error vector E includes four, (er(1), ei(1), er(2), ei(2)). That is, when N=2, Equation (22) can be given as solutions of simultaneous equations with four unknowns where the error E becomes zero.

Thus, ($\alpha 1$, $\alpha 2$, $\beta 0$, $\beta 1$) that make the error E the least square are obtained on the basis of the angular frequencies (ω(1), ω(2), . . . , ω(n)), the reference phase gains (a(1), a(2), . . . , a(N)), and the 90-degree-delay phase gains (b(1), b(2), . . . , b(N)).

Now, in order to uniquely determine unknowns, an approximation is made that the primary inductance Ls and the secondary inductance Lr are equal and the value is L (L=Ls=Lr). Then, Equation (23) is obtained by comparing the calculated ($\alpha 1$, $\alpha 2$, $\beta 0$, $\beta 1$) and the coefficients of Equation (11).

$$\begin{aligned} Rs &= \frac{1}{\alpha 1 \beta 0 - \beta 1} \\ Rr &= \frac{\beta 0 \beta 1}{\beta 0 \beta 1} \end{aligned} \quad (23)$$

$$L = \frac{\alpha 1 \beta 0 - \beta 1}{\beta 0^2}$$

$$M = \sqrt{\frac{(\alpha 1 \beta 0 - \beta 1)^2}{\beta 0^4} - \frac{\alpha 2(\alpha 1 \beta 0 - \beta 1)}{\beta 0^2 \beta 1}}$$

In this way, by using Equations (22) and (23), the rotating machine constant calculating means 7 outputs the constants of the rotating machine (primary resistance Rs, secondary resistance Rr, self-inductance L, and mutual inductance M)

on the basis of the relation between the rotating machine transfer characteristic gains calculated about the N angular frequencies determined by the test numbers n, and the reference phase gains and the 90-degree-delay phase gains. That is to say, the rotating machine constant calculating means 7 does not require simultaneous equations corresponding to the number of unknown constants, and so there is no restriction as to the number of times that the alternating voltage frequency is selected during the single-phase power supply, and thus the test can be repeated many times to obtain enhanced accuracy in determining the constants. Also, because the rotating machine constant calculating means 7 obtains the rotating machine constants (primary resistance Rs, secondary resistance Rr, self-inductance L, and mutual inductance M) by using Equations (22) and (23), it is possible to make errors about the deviations take the least squares.

Figure 4:
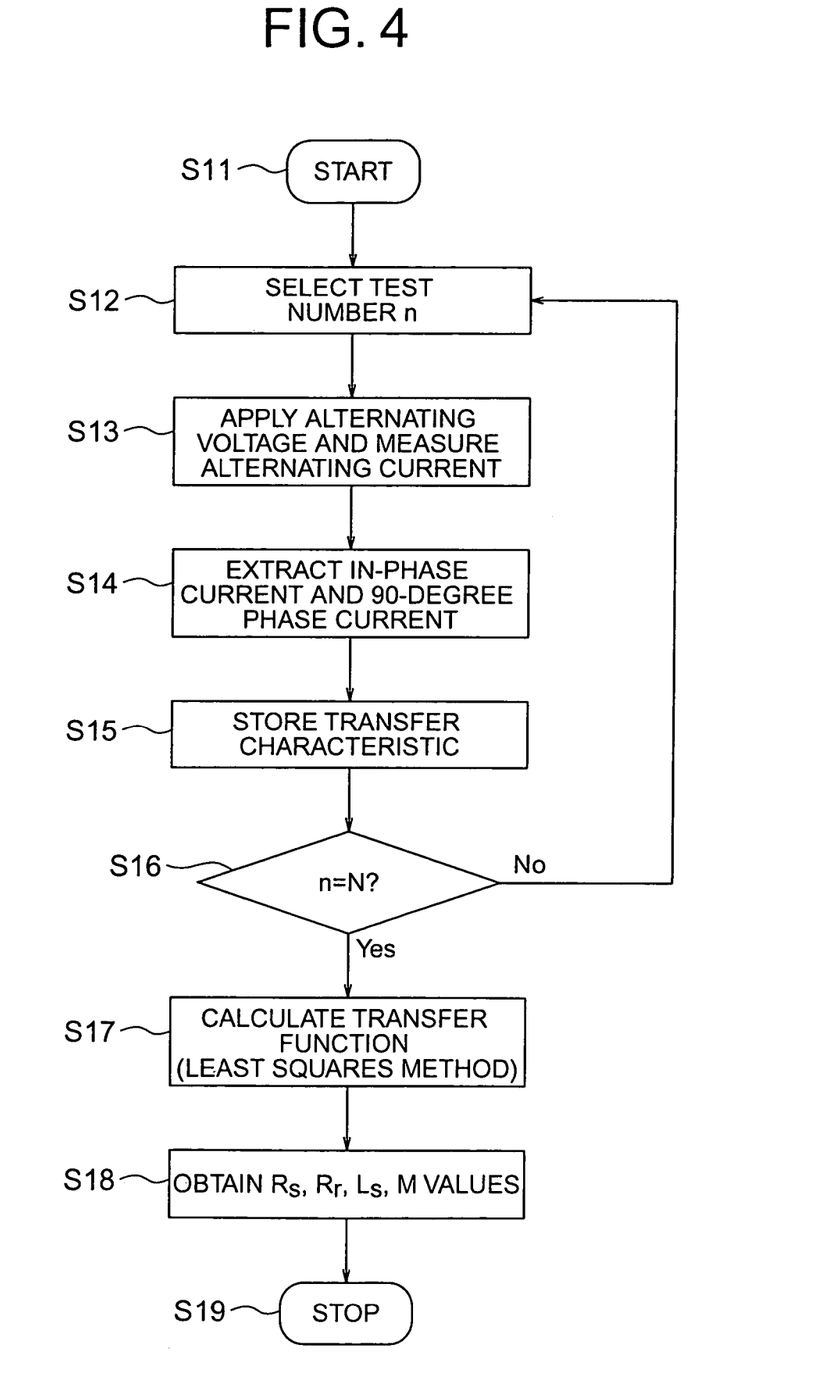
FIG. 4 is a flowchart showing a process performed by the device for determining a constant of a rotating machine according to the first embodiment of the present invention.

The above-described operations of the embodiment will be explained referring to FIG. 4. FIG. 4 is a flowchart showing the operations of the device for determining a constant of a rotating machine according to the first embodiment.

A rotating machine constant determination is started in Step S11 and then the test number selecting means 1 selects a test number, from 1 to N, in Step S12. In Step S13, the inverter 2 applies the alternating voltage to the induction machine 5 while the current detectors 6 detect the alternating current.

In Step S14, on the basis of the instantaneous current values obtained by the current detectors 6, the current extractor 3 extracts in-phase component ia(n) and 90-degree-delay phase component ib(n) with respect to the alternating voltage outputted from the inverter 2.

In Step S15, on the basis of ia(n) and ib(n) provided from the current extractor 3, the transfer characteristic memory 4 calculates and stores a(n) and b(n).

In Step S16, when n≠N, the operations from Step S12 to Step 15 are repeated, and when n=N, the transfer characteristic memory 4 outputs the reference phase gains (a(1), a(2), ..., a(N)) and the 90-degree-delay phase gains (b(1), b(2), ..., b(N)) to the rotating machine constant calculating means 7 after a predetermined time has passed.

In Step S17, on the basis of the reference phase gains (a(1), a(2), ..., a(N)) and the 90-degree-delay phase gains (b(1), b(2), ..., b(N)), the rotating machine constant calculating means 7 obtains the transfer function coefficients ($\alpha 1, \alpha 2, \beta 0, \beta 1$) that make the error vector E the least square.

In Step S18, on the basis of the calculated ($\alpha 1, \alpha 2, \beta 0, \beta 1$), the rotating machine constant calculating means 7 calculates Equation (23) and outputs Rs, Rr, M, and L, whereby the process ends in Step S19.

While the description above has shown current detectors 6 provided for U-phase and V-phase, a current detector 6 may be provided only for U-phase. The relation iv=iw holds when the inverter 2 applies the alternating voltage shown by Equations (2) to (4) in a standstill state, and so iv is given by Equation (24) and iw is given by Equation (6).

$$iv = -0.5 \times iu \qquad (24)$$

As described so far, according to the embodiment, the test means 8 supplies given alternating voltage to the induction machine 5 on the basis of the test number n and the phase signal q, and outputs the reference phase gains (a(1), a(2), ..., a(N)) and 90-degree-delay phase gains (b(1), b(2), ..., b(N)) based on the phase signal q. It is thus possible to determine, a large number of times, the electric constants of the rotating machine (primary resistance Rs, secondary resistance Rr, self-inductance L, and mutual inductance M) on the basis of the real part and imaginary part of the transfer function of the induction machine 5, whereby the accuracy of determination of the constants is enhanced. Also, because the embodiment does not require simultaneous equations about the gain of the rotating machine, no problem arises even if a frequency band where the gain is fixed is included, as long as the reference phase gain and the 90-degree-delay phase gain are different, whereby the alternating voltage frequency bands can be selected arbitrarily.

Second Embodiment

In the first embodiment above, the current extractor 3 samples id when the phase signal q obtained from the test number selecting means 1 becomes $\pi/2$, $\pi$, $3\pi/2$, and $2\pi$ to extract the in-phase component ia(n) and 90-degree-delay phase component ib(n), but the current extractor 3 may be replaced by a current extractor 3a (not shown) that operates on the basis of maximum and minimum values of id and the phase.

This embodiment will describe an example of the replacement. The device for determining a constant of a rotating machine of this embodiment is configured basically the same as that of the first embodiment, and will therefore be described referring to FIG. 1, with the current extractor 3a substituting for the current extractor 3 of FIG. 1.

Figure 5:
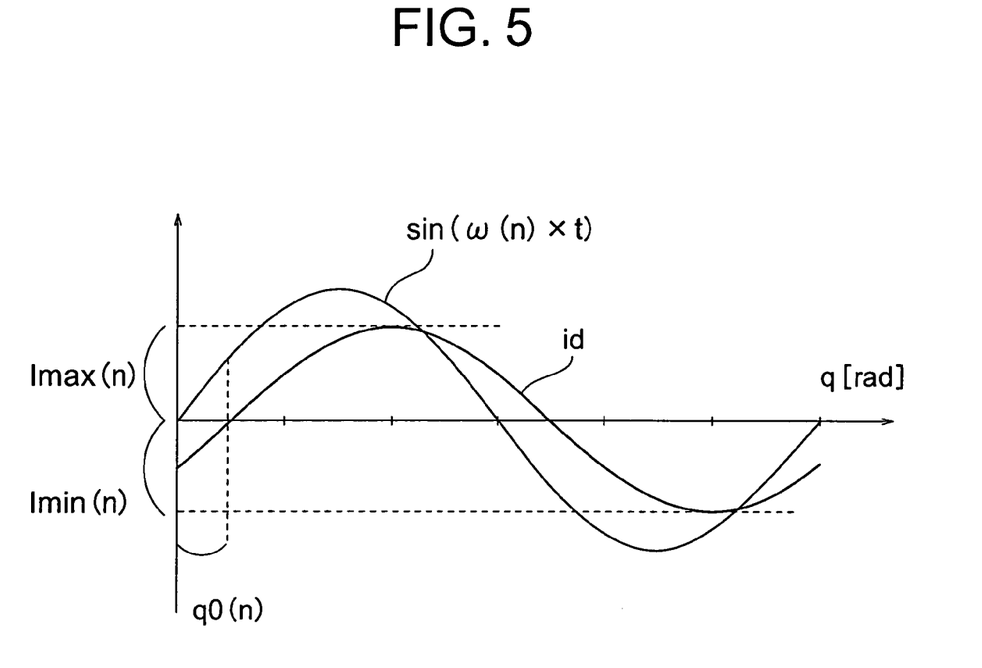
FIG. 5 is an illustrative diagram used to describe operations of a current extractor of a device for determining a constant of a rotating machine according to a second embodiment of the present invention.

FIG. 5 shows the principle of operations of the current extractor 3a. With a test number n, the alternating voltage of the d-axis voltage command vd on the orthogonal two axes is in the same phase as sin(q), and its amplitude is V(n). Then, the current extractor 3a stores the maximum value Imax(n) of id and the minimum value Imin(n) of id during the test number n period. The alternating current amplitude In is given by Equation (25).

$$I(n) = (I\max(n) - I\min(n)) \times 0.5 \qquad (25)$$

Also, the current extractor 3a stores, as q0(n), the value of q at which id crosses zero, i.e., the value of q at which the sign changes from negative to positive. From Equations (26) and (27), the current extractor 3a outputs ia(n) and ib(n).

$$ia(n) = I(n)\cos(q0(n)) \qquad (26)$$

$$ib(n) = -I(n)\sin(q0(n)) \qquad (27)$$

Then, when the test number n changes to n+1, the ia(n) and ib(n) are outputted to the transfer characteristic memory 4.

As above, during a test number n period, the current extractor 3a extracts the in-phase component ia(n) and 90-degree-delay phase component ib(n) on the basis of the maximum value Imax(n) of id, the minimum value Imin(n) of id, and the value of q at the zero-cross-point of id, whereby the current extraction is achieved with a simple calculation without a need for integration.

Third Embodiment

With an application of sine-wave alternating voltage, no problem arises when the alternating current sine-waveform is sufficient for the extraction of the in-phase component ia(n) and 90-degree-delay phase component ib(n), but it may be embedded in noise. Accordingly, the current extractor 3 of the first embodiment may be replaced by a current extractor 3b shown in FIG. 6 that operates on the basis of a cross-correlation function.

Figure 6:
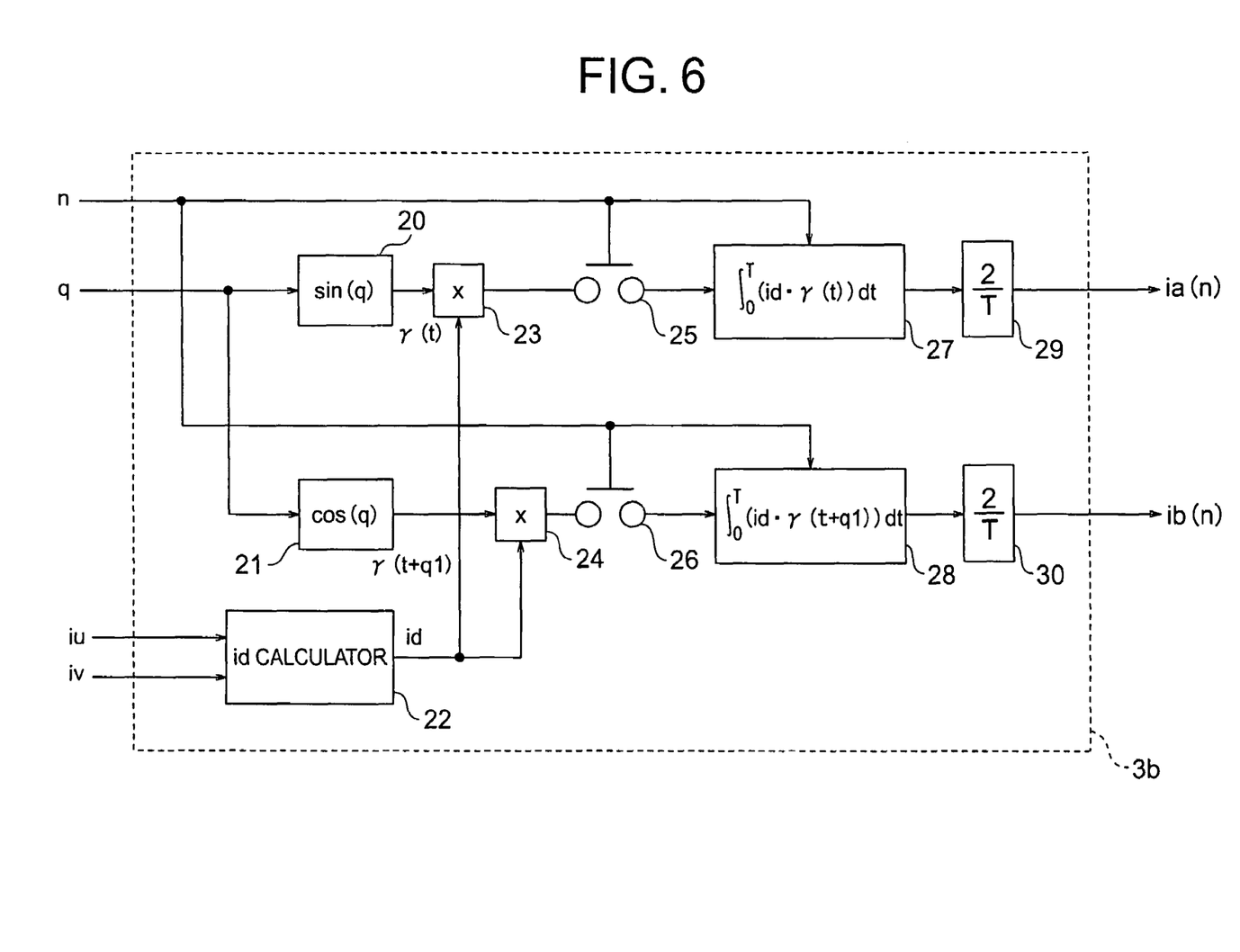
FIG. 6 is a block diagram illustrating the configuration of a current extractor of a device for determining a constant of a rotating machine according to a third embodiment of the present invention.

This embodiment will describe an example of the replacement. The entire configuration of the device for determining a constant of a rotating machine of this embodiment is basically the same as that of the first embodiment, and will therefore be described referring to FIG. 1 with the current extractor 3 of FIG. 1 replaced by the current extractor 3b. In FIG. 6, 20 and 21 are function calculators, 22 is an id calculator, 23 and 24 are multipliers, 25 and 26 are switches, 27 and 28 are integrators, and 29 and 30 are gains.

First, the operating principle will be described. Suppose that id is expressed by Equation (28) below when the d-axis voltage command vd on orthogonal two axes is given to the induction machine 5 on the basis of Equations (2) and (3) as shown in the first embodiment.

$$id = I \times \sin(\omega(n) \times t + \phi) + \xi(t) \quad (28)$$

Where $\xi(t)$: noise.

Also, a signal $\gamma$ in the same phase with vd is defined by Equation (29).

$$\gamma(t) = \sin(\omega(n) \times t) \quad (29)$$

Then, across-correlation function $F(\tau)$ for id and $\gamma$ is obtained by Equation (30).

$$F(\tau) = \lim_{T \to \infty} \frac{1}{T} \int_0^T (id \cdot \gamma(t+\tau)) dt \quad (30)$$
$$= \lim_{T \to \infty} \frac{1}{T} \int_0^T (I \sin(\omega(n) \cdot t + \psi) \sin(\omega n \cdot (t+\tau))) dt +$$
$$\lim_{T \to \infty} \frac{1}{T} \int_0^T (\xi(t) \cdot \sin\{\omega(n) \cdot (t+\tau)\}) dt$$

Where, $\gamma(t+\tau) = \sin(\omega(n) \times (t+\tau))$.

The second term in Equation (30) becomes zero when a mean is obtained for a sufficiently long time and so $F(\tau)$ is expressed as Equation (31).

$$F(\tau) = I \times \cos(\omega(n) \times \tau - \phi) \div 2 \quad (31)$$

From Equation (31), $F(0)$ and $F(q1)$ are given by Equations (32) and (33), respectively.

$$F(0) = I \times \cos \phi \div 2 \quad (32)$$

$$F(q1) = I \times \sin \phi \div 2 \quad (33)$$

Where $q1 = \pi/(2\omega(n))$.

From Equations (32) and (33), the in-phase component ia(n) of id and the 90-degree-delay phase component ib(n) are given by Equations (34-1) and (34-2).

$$ia(n) = 2 \times F(0)$$

$$ib(n) = 2 \times F(q1)$$

When $\tau = q1$, $\gamma(t+\tau)$ is given by Equation (35).

$$\gamma(t+\tau) = \gamma(t+q1) \quad (35)$$
$$= \sin(\omega(n) \times t + \pi/2)$$
$$= \cos(\omega(n) \times t)$$

Next, the current extractor 3b will be described referring to FIG. 6. In actual calculation of Equation (30), the integration time T cannot be infinite, and so T is given as a certain time that is sufficiently larger than the period $2\pi/\omega(n)$. It may be around five to ten times larger than the period $2\pi/\omega(n)$.

The function calculator 20 outputs sin(q) (=$\gamma$(t)) on the basis of the phase signal q(=$\omega$(n)×t). The function calculator 21 outputs cos(q) (=$\gamma$(t+q1)) on the basis of the phase signal q (=$\omega$(n)×t).

The id calculator 22 calculates and outputs id on the basis of Equations (5) and (6).

The multiplier 23 multiplies together the outputs of the function calculator 20 and the id calculator 22 and outputs id·$\gamma$(t).

The multiplier 24 multiplies together the outputs of the function calculator 21 and the id calculator 22 and outputs id·$\gamma$(t+q1).

The switch 25 and the switch 26 perform short-circuit operation until the given period T passes after the test number has changed from n−1 to n, and perform open operation until the test number changes from n to n+1 after the given time T has passed.

The integrator 27 performs reset operation immediately after the test number has changed from n−1 to n and performs integration operation until the given time T passes after the reset, to output $\int id \cdot \gamma$ (t)dt.

The integrator 28 performs reset operation immediately after the test number has changed from n−1 to n and performs integration operation until the given time T passes after the reset, to output $\int id \cdot \gamma$ (t+q1)dt.

The gain 29 multiplies $\int id \cdot \gamma$ (t)dt, inputted from the integrator 27, by 2/T, so as to output ib(n) (=2×F(0)).

The gain 30 multiplies $\int id \cdot \gamma$ (t+q1)dt, inputted from the integrator 28, by 2/T, to output ib(n) (=2×F(q1)).

This configuration, based on the cross-correlation function, enables the current extractor 3b to extract the in-phase component ia(n) and 90-degree-delay phase component ib(n) even when id is embedded in noise.

In the third embodiment, an arbitrary value is set as the period T, and it may be set to an integer multiple of $2\pi/\omega(n)$.

Also, because the period T is an arbitrary value, even when it cannot be an integer multiple of $2\pi/\omega(n)$ because of sampling periods of the current detectors 6, it may be set to an integer multiple of the current sampling period of the current extractor 3b to enable the extraction of the in-phase component ia(n) and 90-degree-delay phase component ib(n) even when id is embedded in noise.

As described so far, according to the embodiment, the configuration based on cross-correlation function allows the current extractor 3b to extract the in-phase component ia(n) and the 90-degree-delay phase component ib(n) even when id is embedded in noise, whereby the rotating machine constants required to drive the rotating machine can be accurately obtained in such cases.

Fourth Embodiment

Figure 7:
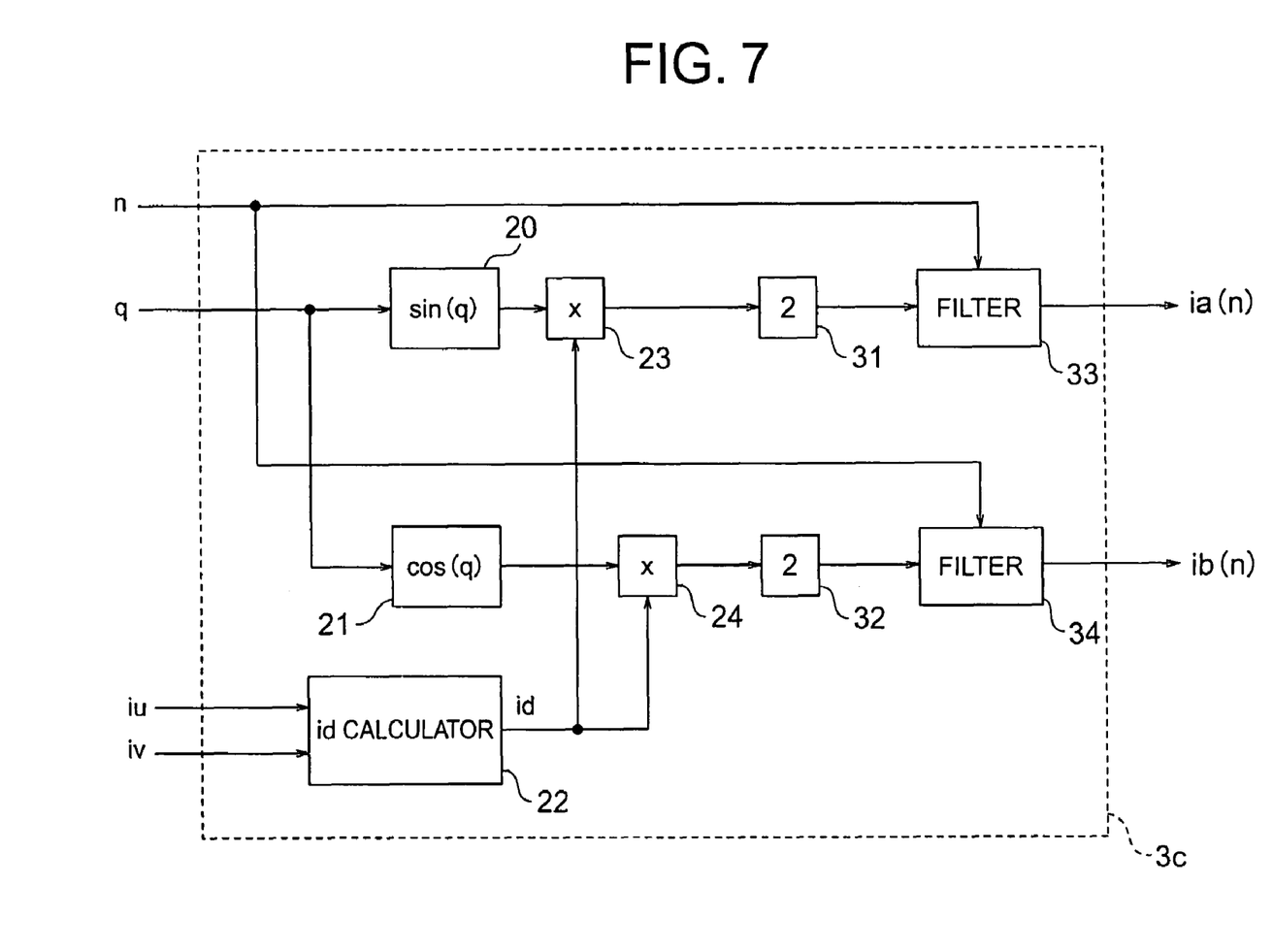
FIG. 7 is a block diagram illustrating the configuration of a current extractor of a device for determining a constant of a rotating machine according to a fourth embodiment of the present invention.

While the third embodiment describes a method of extracting the in-phase component ia(n) and the 90-degree-delay phase component ib(n), with the alternating voltage vd, on the basis of the cross-correlation function, the current extractor 3b of the third embodiment may be replaced by a current extractor 3c shown in FIG. 7 that uses filters. In FIG. 7, the components 20 to 24 are the same as, or correspond to, those shown in FIG. 6, and will not be described here again.

This embodiment describes an example of the replacement. The entire configuration of the device for determining a constant of a rotating machine of this embodiment is basically the same as that of the first embodiment and will therefore be described referring to FIG. 1 with the current extractor 3 of FIG. 1 replaced by the current extractor 3c. In FIGS. 7, 31 and 32 are gains, and 33 and 34 are filters.

The gain 31 doubles the output from the multiplier 23 to output 2·id·$\gamma$(t). When id is given by Equation (28), the output of the gain 31, {2·id·$\gamma$(t)}, can be transformed to Equation (36).

$$2 \cdot id \cdot \gamma(t) = I \cos \phi - I \cos(2 \times \omega(n) \times t + \phi) + \xi(t) \sin(\omega(n) \times t) \quad (36)$$

In the right side of Equation (36), the first term is a constant, the second term is a sine wave that varies with the angular frequency 2ω(n), and the third term is noise.

The gain 32 doubles the output of the multiplier 23 to output 2·id·γ(t+q1). When id is given by Equation (28) as mentioned above, the output of the gain 32, {2·id·γ (t+q1)}, can be transformed into Equation (37).

$$2\cdot id\cdot\gamma(t+q1)=I\sin\phi+I\sin(2\times\omega(n)\times t+\phi)+\xi(t)\cos(\omega(n)\times t) \quad (37)$$

In the right side of Equation (37), the first term is a constant, the second term is a sine wave that varies with the angular frequency 2ω(n), and the third term is noise.

The filter 33, with a low-pass filter or a notch filter, or with both, receives Equation (36) outputted from the gain 31, and intercepts the signal component of the angular frequency 2ω(n) and the signal component of noise, and passes only the first term of the right side of Equation (36), which is outputted as ia(n).

The filter 34, with a low-pass filter or a notch filter, or with both, receives Equation (37) outputted from the gain 32, and intercepts the signal component of the angular frequency 2ω(n) and the signal component of noise, and passes only the first term of the right side of Equation (37), which is outputted as ib(n).

Thus, in the current extractor 3c, with a low-pass filter or a notch filter, or with both, the signal components of the angular frequency 2ω(n) and noise are intercepts and only the first term on the right side of Equation (37) is passed and outputted as ib(n), whereby the in-phase component ia(n) and 90-degree-delay phase component ib(n) can be extracted even when id is embedded in noise.

Fifth Embodiment

The fourth embodiment shows an example including the steps of applying alternating voltage, extracting an in-phase component ia(n) and a 90-degree-delay phase component ib(n) from detected current id, storing the transfer characteristic about the test number n using the results, and calculating rotating machine constants using the N kinds of results.

However, when applying an alternating voltage, the amplitude of the current id differs depending on the test number n, and therefore, with a rotating machine susceptible to magnetic saturation, inductance values differ depending on the test number.

This embodiment makes it possible to fix the alternating current amplitude independently of the test number n so as to obtain enhanced accuracy in determining inductance values even with a rotating machine that undergoes large inductance variations because of saturation.

Figure 8:
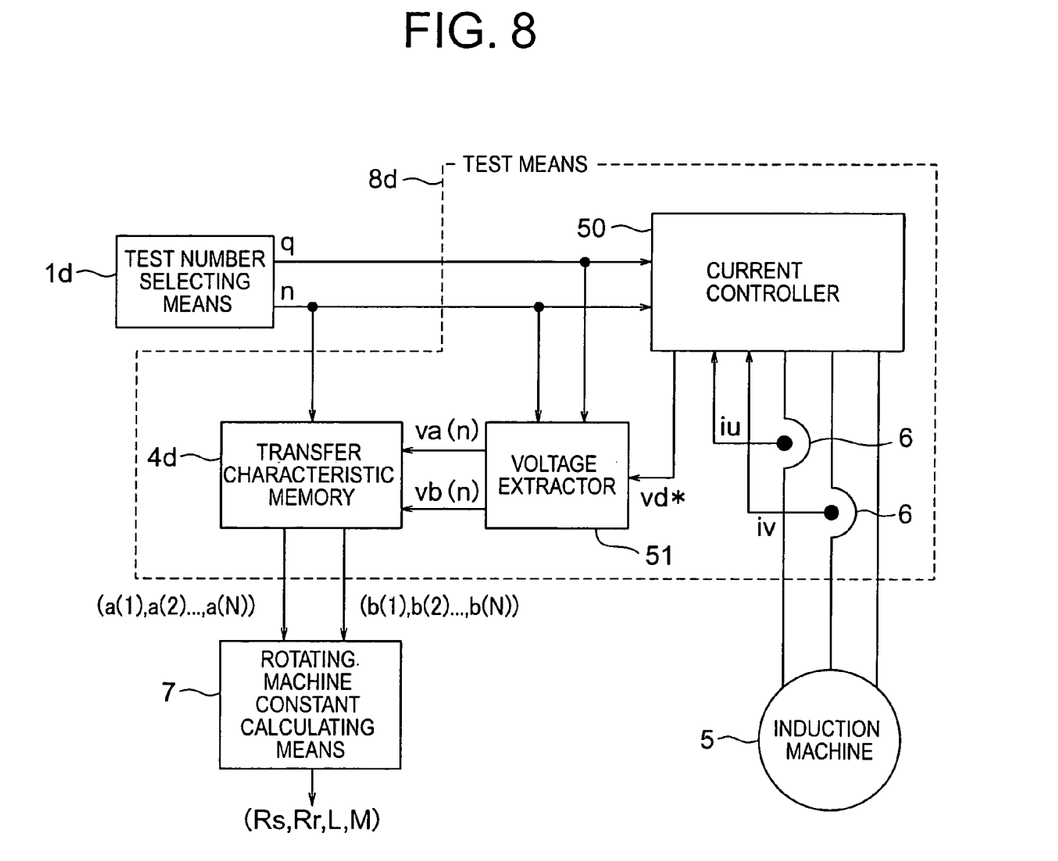
FIG. 8 is a block diagram illustrating the configuration of a device for determining a constant of a rotating machine according to a fifth embodiment of the present invention.

FIG. 8 is a diagram illustrating a device for determining a constant of a rotating machine according to a fifth embodiment for implementing the invention. In FIG. 8, the components shown with the same reference characters as those in FIG. 1 are the same or corresponding components, and they are not described again here. In FIG. 8, 1d is test number selecting means, 4d is a transfer characteristic memory, 50 is a current controller, 51 is a voltage extractor, and 8d is test means.

In FIG. 8, the test number selecting means 1d outputs N kinds of, from 1 to N, test numbers n to the test means 8d according to predetermined timing and also outputs a phase signal q.

The test means 8d includes the current controller 50, voltage extractor 51, transfer characteristic memory 4d, and current detectors 6.

The current controller 50 applies voltage on the basis of instantaneous current values obtained from the current detectors 6 so that the induction machine (rotating machine) 5 generates predetermined alternating current according to the test number n obtained from the test number selecting means 1d. The current controller 50 also outputs an alternating voltage command vd* on two orthogonal axes to the voltage extractor. Also, the current controller 50 sets an alternating current command value as shown by Equation (38) on the basis of the test number n and the phase signal q obtained from the test number selecting means according to the test number n.

$$id^* = I \times \sin(q) + C \quad (38)$$

Where, C: an arbitrary constant.

While, in this embodiment, the value of C is set as C=0 for the sake of simplicity of explanation, an arbitrary value may be given to obtain the same effect.

A current command id is calculated on the basis of iu and iv obtained from the current detectors 6 and Equations (5) and (6). Then, a voltage command vd* that makes id* and id agree is calculated according to Equation (39).

$$vd^* = Kp(id^* - id) + Ki \int (id^* - id)dt \quad (39)$$

Where,
Kp: proportion gain, and
Ki: integral gain.

Then, three-phase voltages vu, vv, and vw are given by Equation (40).

$$\begin{pmatrix} vu \\ vv \\ vw \end{pmatrix} = \sqrt{\frac{2}{3}} \begin{pmatrix} 1 \\ -\frac{1}{2} \\ -\frac{1}{2} \end{pmatrix} vd^* \quad (40)$$

From vd* obtained from the current controller according to the test number n, the voltage extractor 51 extracts an in-phase component va(n) and a 90-degree-delay phase component vb(n) with respect to the alternating current command, and outputs the va(n) and vb(n) to the transfer characteristic memory 4d when the test number n changes.

The voltage extractor 51 extracts the in-phase component va(n) and the 90-degree-delay phase component vb(n) by sampling vd* when the phase signal q obtained from the test number selecting means 1 becomes π/2, π, 3π/2, and 2π.

Figure 9:
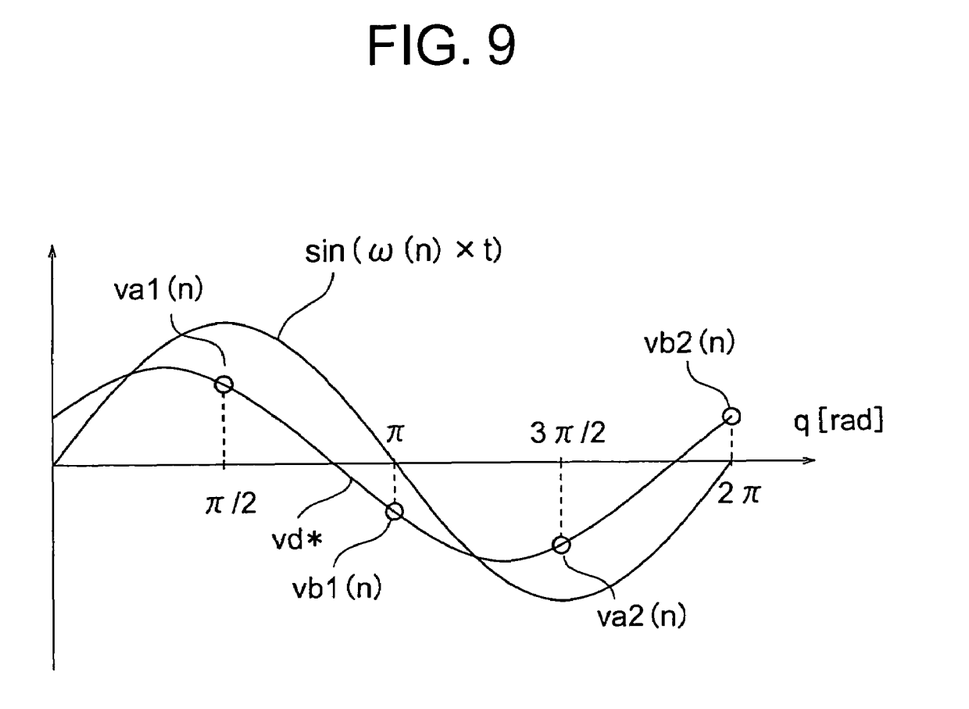
FIG. 9 is an illustrative diagram used to describe operations of the voltage extractor of the device for determining a constant of a rotating machine according to the fifth embodiment of the present invention.

Referring to FIG. 9, a method will be described in which the voltage extractor 51 extracts, from vd* obtained from the current controller 50, the in-phase component va(n) and 90-degree-delay phase component vb(n) with respect to the alternating voltage outputted from the inverter 2, according to the test number n.

Suppose that, during the period of a test number n obtained from the test number selecting means 1, vd* is va1(n) when the phase signal q obtained from the test number selecting means 1 is π/2 and vd* is va2(n) when the phase signal q is 3π/2. Similarly, suppose that vd* is vb1(n) when the phase signal q is π and vd* is vb2(n) when the phase signal q is 2π. Then, the in-phase component va(n) and the 90-degree-delay phase component vb(n) are given by Equations (41) and (42).

$$va(n) = (va1(n) - va2(n)) \div 2 \quad (41)$$

$$vb(n) = (vb1(n) - vb2(n)) \div 2 \quad (42)$$

Then, when the test number n changes to n+1, the voltage extractor 51 outputs the va(n) and vb(n) to the transfer characteristic memory 4*d*. However, when the test number is N, the voltage extractor 51 outputs va(N) and vb(N) to the transfer characteristic memory 4*d* when a predetermined time passes.

Next, operations of the transfer characteristic memory 4*d* will be described.

On the basis of va(n) and vb(n) provided from the voltage extractor 51 when the test number n, obtained from the test number selecting means, changes to n+1, the transfer characteristic memory 4*d* calculates the amplitude V(n) of vd*, and sine and cosine about a phase difference φ between id and vd*.

$$V(n)=\sqrt{va(n)^2+vb(n)^2} \quad (43)$$

$$\cos\psi = \frac{va(n)}{V(n)} \quad (44)$$

$$\sin\psi = \frac{vb(n)}{V(n)} \quad (45)$$

On the basis of the V(n), φ, and previously stored alternating current command amplitude I, a(n) and b(n) are calculated according to Equations (46) and (47).

$$a(n)=I \div V(n) \times \cos\phi \quad (46)$$

$$b(n)=I \div V(n) \times \sin\phi \quad (47)$$

Then, when a predetermined time has passed after the test number became N, the transfer characteristic memory 4*d* outputs the reference phase gains (a(1), a(2), . . . , a(N)) and the 90-degree-delay phase gains (b(1), b(2), . . . , b(N)) to the rotating machine constant calculating means 7.

Conventional devices for determining a constant of a rotating machine do not consider current amplitude and are therefore incapable of determining inductance values required to actually drive rotating machines. In contrast, according to the embodiment, the current controller 50 equalizes the amplitudes of the current id independently of the test number n, and so the influence of magnetic saturation on inductance stays constant independently of the test number n, whereby the inductance determining accuracy is enhanced.

While the fifth embodiment describes the voltage extractor 51 that operates on a principle similar to that of the current extractor 3, it may operate on a principle similar to that of the current extractor 3*a* to provide the same effect as the fifth embodiment. Also, the voltage extractor 51 may operate on a principle similar to that of the current extractor 3*b* to provide the same effect as the fifth embodiment. Furthermore, the voltage extractor 51 may operate on a principle similar to that of the current extractor 3*c* to provide the same effect as the fifth embodiment.

Sixth Embodiment

In the fifth embodiment, the unknown constants of the rotating machine include four constants Rs, Rr, M, and L, and the rotating machine constant calculating means calculates (α1, α2, β0, β1) that make the error vector E the least square. However, as is widely known (refer to Patent Document 1), the primary resistance Rs can be determined by previously applying dc voltage to the rotating machine.

Accordingly, a sixth embodiment regards Rs as already known and determines the three unknown constants Rr, M, and L of the rotating machine.

When Rs is known, the rotating machine constant calculating means 7 of the first to fifth embodiments may be replaced by rotating machine constant calculating means 7*e* (not shown). This embodiment will explain an example of the replacement. The entire configuration of the device for determining a constant of a rotating machine of this embodiment is basically the same as that of the first to fifth embodiments and will therefore be described referring to FIG. 1 or 8 with the rotating machine constant calculating means 7 of FIG. 1 or 8 replaced by the rotating machine constant calculating means 7*e*.

The rotating machine constant calculating means 7*e* receives the reference phase gains (a(1), a(2), . . . , a(N)) and the 90-degree-delay phase gains (b(1), b(2), . . . , b(N)) from the transfer characteristic memory 4, and then calculates given mathematical expressions to output the rotating machine constants Rr, L, and M.

The principle of operations of the rotating machine constant calculating means 7*e* will be described. Multiplying both sides of the transfer function Equation (11), from alternating voltage to alternating current, by Rs gives Equation (48).

$$RsG(s) = \frac{1+Trs}{1+(Ts+Tr)s+\sigma TsTrs^2} \quad (48)$$
$$= \frac{1+Trs}{1+\alpha 1s+\alpha 2s^2}$$

Next, Ax(s) and Bx(s) are defined by Equations (49) and (50).

$$Ax(s)=1+\alpha 1s+\alpha 2s^2 \quad (49)$$

$$Bx(s)=1+Trs \quad (50)$$

With the test results of a test number n, the reference phase gain is a(n) and the 90-degree-delay phase gain is b(n). Accordingly, the test results with the test number n give the transfer characteristic G0(jω(n)) shown by Equation (51).

$$G0(j\omega(n))=a(n)+j\times b(n) \quad (51)$$

Multiplying both sides of Equation (51) by Rs gives Equation (52).

$$Rs \times G0(j\omega(n))=Rs \times a(n)+j \times Rs \times b(n) \quad (52)$$

On the other hand, Equation (48) with the test number n is Equation (53).

$$Rs \times G(j\omega(n))=Bx(j\omega(n)) \div Ax(j\omega(n)) \quad (53)$$

Multiplying Equation (53) by Ax(jω(n)) gives Equation (54).

$$Ax(j\omega(n))Rs \times G(j\omega(n))=Bx(j\omega(n)) \quad (54)$$

Then, a deviation ex(n) is defined by Equation (55).

$$ex(n)=Ax(j\omega(n))RsG0(j\omega(n))-Bx(j\omega(n)) \quad (55)$$

Because G0(jω(n)) and G(jω(n)) are complex numbers, the deviation ex(n) is also a complex number, and the real part and imaginary part of the deviation ex(n) are defined as exr(n) and exi(n), respectively.

The deviation vector Ex is defined by Equation (56).

$$Ex = \begin{pmatrix} exr(1) \\ exi(1) \\ exr(2) \\ exi(2) \\ \vdots \\ exr(N) \\ exi(N) \end{pmatrix} \quad (56)$$

Then, a product of the deviation vector Ex and the transpose $Ex^T$ of the deviation vector is given by Equation (57) below.

$$Ex \cdot Ex^T = exr(1)^2 + exi(1)^2 + exr(2)^2 + exi(2)^2 + \ldots + exr(N)^2 + exi(N)^2 \quad (57)$$

That is, the left side of Equation (57) is a square of error Ex. Equation (55) is then substituted by Equation (56) to obtain Equation (58).

$$Ex = \begin{pmatrix} -Rs\omega(1)b(1) & -Rs\,(\omega(1))^2 a(1) & 0 \\ Rs\omega(1)a(1) & -Rs\,(\omega(1))^2 b(1) & -\omega(1) \\ -Rs\omega(2)b(2) & -Rs\,(\omega(2))^2 a(2) & 0 \\ Rs\omega(2)a(2) & -Rs\,(\omega(2))^2 b(2) & -\omega(2) \\ \vdots & \vdots & \vdots \\ Rs\omega(N)b(N) & -Rs\,(\omega(N))^2 a(N) & 0 \\ Rs\omega(N)a(N) & -Rs\,(\omega(N))^2 b(N) & -\omega(N) \end{pmatrix} \begin{pmatrix} \alpha 1 \\ \alpha 2 \\ Tr \end{pmatrix} -$$

$$\begin{pmatrix} 1 - Rsa(1) \\ -Rsb(1) \\ 1 - Rsa(2) \\ -Rsb(2) \\ \vdots \\ 1 - Rsa(N) \\ -Rsb(N) \end{pmatrix}$$

$$= Y1 \begin{pmatrix} \alpha 1 \\ \alpha 2 \\ Tr \end{pmatrix} - Y2$$

where, $$Y1 = \begin{pmatrix} -Rs\omega(1)b(1) & -Rs\omega(1)^2 a(1) & 0 \\ Rs\omega(1)a(1) & -Rs\omega(1)^2 b(1) & -\omega(1) \\ -Rs\omega(2)b(2) & -Rs\omega(2)^2 a(2) & 0 \\ Rs\omega(2)a(2) & -Rs\omega(2)^2 b(2) & -\omega(2) \\ \vdots & \vdots & \vdots \\ Rs\omega(N)b(N) & -Rs\omega(N)^2 a(N) & 0 \\ Rs\omega(N)a(N) & -Rs\omega(N)^2 b(N) & -\omega(N) \end{pmatrix}$$

$$Y2 = \begin{pmatrix} 1 - Rsa(1) \\ -Rsb(1) \\ 1 - Rsa(2) \\ -Rsb(2) \\ \vdots \\ 1 - Rsa(N) \\ -Rsb(N) \end{pmatrix}$$

When $N \geq 2$, $(\alpha 1, \alpha 2, Tr)^T$ that minimize the left side of Equation (58), i.e., $(\alpha 1, \alpha 2, Tr)^T$ that make the error Ex the least square, are given by Equation (59).

$$\begin{pmatrix} \alpha 1 \\ \alpha 2 \\ Tr \end{pmatrix} = (Y1^T Y1)^{-1} Y1 Y2 \quad (59)$$

Thus, $(\alpha 1, \alpha 2, Tr)$ that make the error vector Ex the least square are obtained on the basis of the voltage angular frequencies $(\omega(1), \omega(2), \ldots, \omega(n))$, the reference phase gains $(a(1), a(2), \ldots, a(N))$, and the 90-degree-delay phase gains $(b(1), b(2), \ldots, b(N))$.

In order to uniquely determine the unknowns, an approximation is made that the primary inductance and the secondary inductance are equal and the value is L. Then, Equation (60) is obtained by comparing the calculated $(\alpha 1, \alpha 2, Tr)$ and the coefficients of Equation (48).

$$Rr = \frac{Tr}{Rs(\alpha 1 - Tr)} \quad (60)$$

$$L = Rs(\alpha 1 - Tr)$$

$$M = Rs(\alpha 1 - Tr)\sqrt{1 - \frac{\alpha 2}{(\alpha 1 - Tr)Tr}}$$

In the first embodiment, $X1^T X1$ of Equation (22) is a 4-row 4-column matrix and so the calculation of a 4-row 4-column inverse matrix is needed. However, with the rotating machine constant calculating means 7e of this embodiment, $Y1^T Y1$ of Equation (59) is a 3-row 3-column matrix and so the calculation of a 3-row 3-column inverse matrix suffices, without a need for 4-row 4-column inverse matrix calculation, whereby the calculation is simplified.

The invention claimed is:

1. A device for determining a constant of a rotating machine, comprising:

test number selecting means for outputting a test number n, selected from 1 to N ($N \geq 2$), and outputting a phase signal q determined by a predetermined condition that is previously set based on the test number n;

test means for supplying an alternating voltage to the rotating machine based on the test number n and the phase signal q to obtain and output a reference phase gain $(a(1), a(2), \ldots, a(N))$ and a 90-degree-delay phase gain $(b(1), b(2), \ldots, b(N))$ based on values of the phase signal q corresponding to 1 to N of the test number n; and rotating machine constant calculating means receiving the reference phase gain $(a(1), a(2), \ldots, a(N))$ and the 90-degree-delay phase gain $(b(1), b(2), \ldots, b(N))$ and then calculating a constant of the rotating machine using the reference phase gain and the 90-degree-delay phase gain.

2. The device for determining a constant of a rotating machine according to claim 1, wherein the rotating machine constant calculating means outputs the constant of the rotating machine based on a transfer characteristic gain of the rotating machine calculated about N angular frequencies previously set for the respective test numbers n, the reference phase gain, and the 90-degree-delay phase gain.

3. The device for determining a constant of a rotating machine according to claim 1, wherein the test means comprises:
- an inverter that applies to the rotating machine the alternating voltage with a given amplitude according to the test number n, while using, as a reference phase, the phase signal q obtained from the test number selecting means;
- a current detector that detects instantaneous current values of the rotating machine when the inverter applies the alternating voltage;
- a current extractor that extracts an in-phase current component ia(n) and a 90-degree-delay phase current component ib(n) from the instantaneous current values obtained from the current detector in accordance with the test number n, wherein the current extractor uses the phase signal q obtained from the test number selecting means as a reference phase; and
- a transfer characteristic memory that calculates and outputs the reference phase gain (a(1), a(2), ..., a(N)) and the 90-degree-delay phase gain (b(1), b(2), ..., b(N)) to the rotating machine constant calculating means, based on the in-phase current component ia(n) and the 90-degree-delay phase current component ib(n).

4. The device for determining a constant of a rotating machine according to claim 1, wherein the test means comprises:
- a current controller that supplies to the rotating machine an alternating current having an amplitude according to the test number n, based on the phase signal q obtained from the test number selecting means, and that outputs an alternating voltage;
- a current detector that detects instantaneous current values of the rotating machine when the current controller supplies the alternating current;
- a voltage extractor that, from the alternating voltage obtained from the current controller, according to the test number n, extracts an in-phase voltage component va(n) and a 90-degree-delay phase voltage component vb(n), based on the phase signal q obtained from the test number selecting means; and
- a transfer characteristic memory that, based on the in-phase voltage component va(n) and the 90-degree-delay phase voltage component vb(n), calculates the reference phase gain (a(1), a(2), ..., a(N)) and the 90-degree-delay phase gain (b(1), b(2), ..., b(N)) based on phase of the alternating voltage, and that outputs the reference phase gain and the 90-degree-delay phase gain to the rotating machine constant calculating means.

5. The device for determining a constant of a rotating machine according to claim 2, wherein the test means comprises:
- an inverter that applies to the rotating machine the alternating voltage with a given amplitude according to the test number n, while using, as a reference phase, the phase signal q obtained from the test number selecting means;
- a current detector that detects instantaneous current values of the rotating machine when the inverter applies the alternating voltage;
- a current extractor that extracts an in-phase current component ia(n) and a 90-degree-delay phase current component ib(n) from the instantaneous current values obtained from the current detector in accordance with the test number n, wherein the current extractor uses the phase signal q obtained from the test number selecting means as a reference phase; and
- a transfer characteristic memory that calculates and outputs the reference phase gain (a(1), a(2), ..., a(N)) and the 90-degree-delay phase gain (b(1), b(2), ..., b(N)) to the rotating machine constant calculating means, based on the in-phase current component ia(n) and the 90-degree-delay phase current component ib(n).

6. The device for determining a constant of a rotating machine according to claim 2, wherein the test means comprises:
- a current controller that supplies to the rotating machine an alternating current having an amplitude according to the test number n, based on the phase signal q obtained from the test number selecting means, and that outputs an alternating voltage;
- a current detector that detects instantaneous current values of the rotating machine when the current controller supplies the alternating current;
- a voltage extractor that, from the alternating voltage obtained from the current controller, according to the test number n, extracts an in-phase voltage component va(n) and a 90-degree-delay phase voltage component vb(n), based on the phase signal q obtained from the test number selecting means; and
- a transfer characteristic memory that, based on the in-phase voltage component va(n) and the 90-degree-delay phase voltage component vb(n), calculates the reference phase gain (a(1), a(2), ..., a(N)) and the 90-degree-delay phase gain (b(1), b(2), ..., b(N)) based on phase of the alternating voltage, and that outputs the reference phase gain and the 90-degree-delay phase gain to the rotating machine constant calculating means.

* * * * *